(12) United States Patent
Aoto et al.

(10) Patent No.: US 7,938,515 B2
(45) Date of Patent: May 10, 2011

(54) DIELECTRIC FILM STRUCTURE, PIEZOELECTRIC ACTUATOR USING DIELECTRIC ELEMENT FILM STRUCTURE AND INK JET HEAD

(75) Inventors: Hiroshi Aoto, Kanagawa (JP); Kenichi Takeda, Kanagawa (JP); Tetsuro Fukui, Kanagawa (JP); Toshihiro Ifuku, Kangawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 259 days.

(21) Appl. No.: 12/389,710

(22) Filed: Feb. 20, 2009

(65) Prior Publication Data
US 2009/0153626 A1 Jun. 18, 2009

Related U.S. Application Data (62) Division of application No. 11/338,774, filed on Jan. 25, 2006, now Pat. No. 7,513,608, which is a division of application No. 10/769,765, filed on Feb. 3, 2004, now Pat. No. 7,059,711.

(30) Foreign Application Priority Data

Feb. 7, 2003  (JP) ................................. 2003-031681
Feb. 7, 2003  (JP) ................................. 2003-031682

(51) Int. Cl.
*B41J 2/045* (2006.01)
(52) U.S. Cl. ........................................................ 347/68
(58) Field of Classification Search .................... 347/68, 347/69, 70–72; 400/124.14, 124.16; 310/311, 310/324, 327
See application file for complete search history.

(56) References Cited

U.S. PATENT DOCUMENTS 3,946,398 A * 3/1976 Kyser et al. ...................... 347/70
(Continued)

FOREIGN PATENT DOCUMENTS

CN     1111388     11/1995
(Continued)

OTHER PUBLICATIONS

Lin et al., "Epitaxial Growth of Pb $(Zr_{0.2}Ti_{0.8})O_3$ on Si and Its Nanoscale Piezoelectric Properties," *Applied Physics Letters*, vol. 78, No. 14, Apr. 2001, pp. 2034-2036. Ogawa et al., "Controlling the Crystal Orientations of Lead Titanate Thin Films," *Japanese Journal of Applied Physics*, vol. 30, No. 9B, Sep. 1991, pp. 2145-2148.

*Primary Examiner* — K. Feggins
(74) *Attorney, Agent, or Firm* — Fitzpatrick, Cella, Harper & Scinto

(57) ABSTRACT

The present invention provides a dielectric film structure having a substrate and a dielectric film provided on the substrate and in which the dielectric film has (001) face orientation with respect to the substrate, and in which a value u in the following equation (1) regarding the dielectric film is a real number greater than 2:

$$u = (C_c/C_a) \times (W_a/W_c) \quad (1)$$

where, $C_c$ is a count number of a peak of a (001') face of the dielectric film in an Out-of-plane X ray diffraction measurement (here, 1' is a natural number selected so that $C_c$ becomes maximum); $C_a$ is a count number of a peak of a (h'00) face of the dielectric film in an In-plane X ray diffraction measurement (here, h' is a natural number selected so that $C_c$ becomes maximum); $W_c$ is a half-value width of a peak of the (001') face of the dielectric film in an Out-of-plane rocking curve X ray diffraction measurement; and $W_a$ is a half-value width of a peak of the (h'00) face of the dielectric film in an In-plane rocking curve X ray diffraction measurement.

4 Claims, 5 Drawing Sheets

U.S. PATENT DOCUMENTS

| | | |
|---|---|---|
| 4,584,590 A | 4/1986 | Fischbeck et al. |
| 4,825,227 A | 4/1989 | Fischbeck et al. |
| 5,265,315 A | 11/1993 | Hoisington et al. |
| 5,640,437 A | 6/1997 | Grueninger |
| 5,717,157 A | 2/1998 | Tomozawa et al. |
| 6,555,256 B1 | 4/2003 | Christen et al. |
| 6,653,211 B2 | 11/2003 | Unno et al. |
| 6,783,588 B2 | 8/2004 | Aoto et al. |
| 6,927,084 B2 | 8/2005 | Fukui et al. |
| 2002/0076875 A1 | 6/2002 | Wasa et al. |
| 2002/0140320 A1 | 10/2002 | Unno et al. |
| 2004/0066116 A1 | 4/2004 | Matsuda et al. |

FOREIGN PATENT DOCUMENTS

| | | |
|---|---|---|
| EP | 0 656 429 | 6/1995 |
| JP | 53-12138 | 4/1978 |
| JP | 55-11811 | 1/1980 |
| JP | 62-22790 | 5/1987 |
| JP | 6-350154 | 12/1994 |
| JP | 7-33089 | 4/1995 |
| KR | 2002-86461 | 11/2002 |

* cited by examiner

DIELECTRIC FILM STRUCTURE, PIEZOELECTRIC ACTUATOR USING DIELECTRIC ELEMENT FILM STRUCTURE AND INK JET HEAD

This is a divisional application of application Ser. No. 11/338,774, filed on Jan. 25, 2006, now allowed, which is a divisional application of application Ser. No. 10/769,765, filed on Feb. 3, 2004, now U.S. Pat. No. 7,059,711, issued Jun. 13, 2006.

BACKGROUND OF THE INVENTION

1. Field of the Invention

The present invention relates to a dielectric film structure having excellent dielectric property, piezoelectric property, pyroelectric property and ferroelectric property and available as an element such as an actuator, a memory or a sensor. Further, the present invention relates to a piezoelectric actuator having such a dielectric film structure. Furthermore, the present invention relates to an ink jet head utilizing such a piezoelectric actuator as a discharge pressure generating element for discharging liquid.

2. Related Background Art

Presently, a dielectric film structure having a dielectric film including solid solution of lead titanate zirconate (Pb(Zr, Ti)O$_3$, PZT), barium titanate (BaTiO$_3$), lead titanate zirconate-lead magnesium niobate (Pb(Zr, Ti)O$_3$—Pb(Mg$_{1/3}$Nb$_{2/3}$)O$_3$, PZT-PMN) has widely been used for various elements such as actuators, memories and sensors by utilizing dielectric, piezoelectric, pyroelectric and ferroelectric properties thereof. At present, as electronic/electric equipment has been made compact and made to have a high function, there has been highly requested for compactness and a high integrating ability of the element itself.

For example, a piezoelectric actuator having the dielectric film structure has been utilized as ink discharging means of an ink jet printer which has been popularized as an output device of a personal computer.

Various types of ink jet heads utilizing the piezoelectric actuator are known. As such types, for example, there are a bi-morph type disclosed in Japanese Patent Publication No. S53-12138 (1978), a uni-morph type disclosed in Japanese Patent Publication No. S62-22790 (1987) and a share mode type disclosed in U.S. Pat. No. 4,584,590, Japanese Patent Publication No. H7-33089 (1995) and U.S. Pat. No. 5,265,315.

Figure 4A:
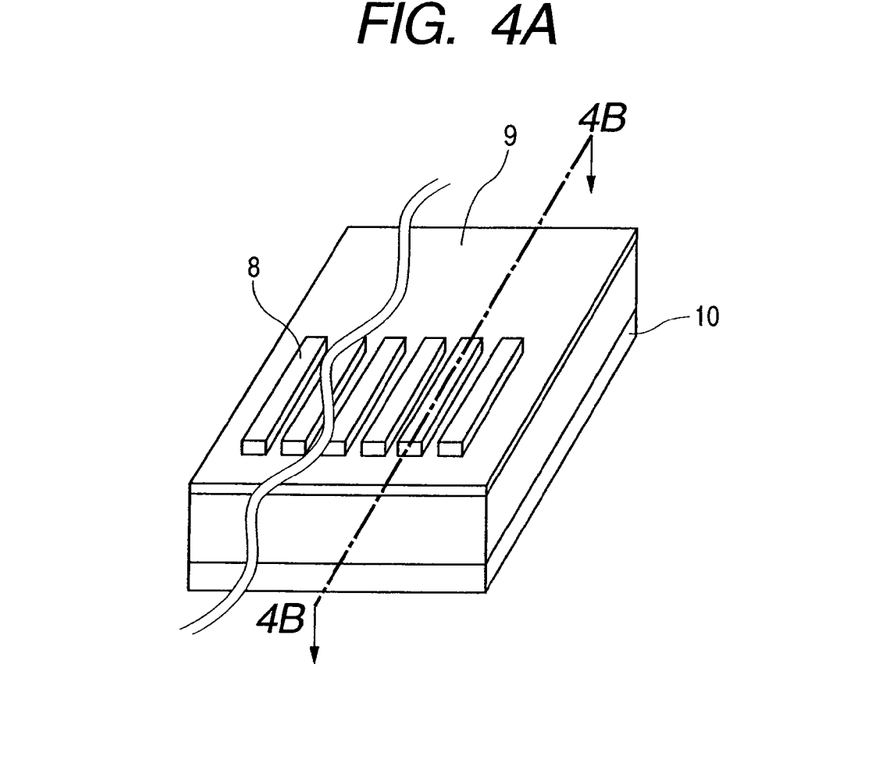
FIG. 4A is a perspective view of an ink jet head of uni-morph type and FIG. 4B is a sectional view of the ink jet head of uni-morph type, taken along the line 4B-4B in FIG. 4A.
Figure 4B:
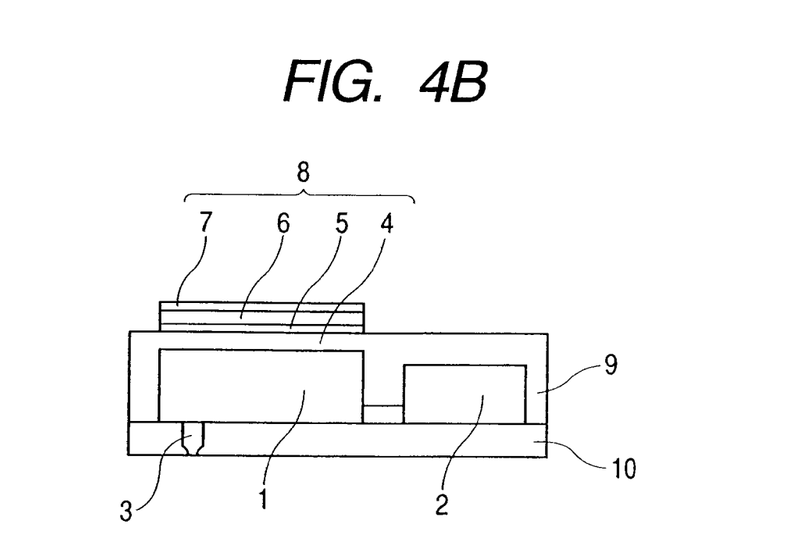

Now, an ink jet head will be explained with reference to an ink jet head using a piezoelectric actuator of uni-morph type. FIG. 4A is a perspective view of an ink jet head of uni-morph type and FIG. 4B is a sectional view taken along the line 4B-4B in FIG. 4A. The ink jet head mainly formed from three parts comprising a piezoelectric actuator 8, a flow path substrate 9 and a nozzle plate 10. A plurality of nozzles 3 are formed in the nozzle plate at predetermined pitch and pattern and each nozzle forms a discharge port at a back side of the flow path substrate, which is an opening through which ink is discharged. Further, the nozzles correspond to respective actuator and ink pressurizing chambers 1 are formed in the flow path substrate in correspondence to the respective nozzles.

The nozzle plate and the flow path substrate are joined together so that the nozzles are communicated with the corresponding ink pressurizing chambers. Further, a common ink chamber 2 is formed in the flow path substrate and all plural ink pressurizing chambers are communicated with the common ink chamber. One (ceiling portion in the drawings) of side walls of the ink pressurizing chamber 1 also acts as a vibrating plate 4 of the piezoelectric actuator. A lower electrode 5, a dielectric film 6 and an upper electrode 7 are laminated in order on the vibrating plate, thereby constituting the piezoelectric actuator.

When the ink is discharged, the ink is supplied from the common ink chamber 2 to the ink pressurizing chamber 1 thereby to fill the ink pressurizing chamber 1. In this condition, by applying voltage to the upper electrode 7 and the lower electrode 5 of the piezoelectric actuator 8, the dielectric film 6 can be contracted or expanded in a direction parallel to a surface of the film. As a result, the piezoelectric actuator 8 is flexed toward inside or outside of the ink pressurizing chamber 1. For example, when the piezoelectric actuator is flexed toward the inside of the ink pressurizing chamber, the ink in the ink pressurizing chamber is pressurized, so that an ink droplet can be discharged from the nozzle by the pressure.

The dielectric film of the ink jet head which has presently been popularized is normally formed by screen printing of piezoelectric ceramic paste. The piezoelectric ceramic paste is obtained by adding a small amount of organic binder to raw material powder of piezoelectric material. The piezoelectric ceramic paste is patterning-coated by screen printing on the lower electrode in correspondence to the ink pressurizing chambers formed at the predetermined pitch and, thereafter, sintering is performed, thereby obtaining a multi crystal dielectric film.

However, in consideration of development of high density of nozzle arrangement and lengthening of the ink jet head (increase in the number of nozzles per one head), the method using the screen printing has the following problems.

In a case where the high density of the nozzle arrangement in the ink jet head is sought, a width of the ink pressurizing chamber must be decreased accordingly and greater displacement of the piezoelectric actuator is required. Accordingly, in order to achieve higher density of the nozzle arrangement, the dielectric film obtained by the screen printing may not provide a satisfactory piezoelectric property.

Further, in the formation of the dielectric film by using the screen printing, in order to perform the sintering, a temperature range from 950° C. to 1300° C. and a time range from several ten minutes to several hours are required. A pattern of the dielectric film so obtained causes positional deviation from a pattern obtained at a time when the screen printing was performed due to volume contraction during the sintering. Such positional deviation of the dielectric film may cause a great problem regarding influence upon a discharging property as higher density of the nozzle arrangement is achieved and the length of the ink jet head is increased. Further, in general, although minute working of a silicon substrate using a semiconductor manufacturing technique is considered to be bright as means for achieving the high integrating ability of the ink pressurizing chambers, in a case where the dielectric film is formed by the screen printing, deterioration of the silicon substrate due to the heating during the sintering may not be avoided.

In order to solve these problems, there has been developed a technique in which a temperature of a film forming condition is reduced by using a method such as a spattering method, a sol-gel method or a metal organic chemical vapor deposition (MOCVD) method and the properties are improved by controlling a crystal structure of the dielectric film.

For example, Japanese Patent Application Laid-open No. H6-350154 (1994) discloses a dielectric (piezoelectric) film element in which lead titanate zirconate of rhombic crystalline system having (111) orientation greater than 70% is film-formed on a substrate by a spattering method and a dielectric (piezoelectric) film element in which lead titanate zirconate of square crystalline system having (001) orientation greater than 70% is film-formed on a substrate by a spattering method and teaches usage as a liquid jetting device.

However, the dielectric film (piezoelectric) elements disclosed in this document have several problems.

First of all, although the piezoelectric property thereof is improved in comparison with that of a sintering element of multi crystal lead titanate zirconate (PZT), in many cases, such piezoelectric property may be insufficient to realize an ink jet printer having high density nozzle arrangement. Further, endurance of the dielectric film element is smaller than that of a multi crystal PZT sintering element and, if the dielectric film element is used repeatedly, the piezoelectric property thereof may be reduced considerably.

SUMMARY OF THE INVENTION

An object of the present invention is to provide a technique for achieving compactness and a high integrating ability of an element such as an actuator, a memory or a sensor by obtaining excellent dielectric, piezoelectric, pyroelectric and ferroelectric properties and, in particular, to provide a piezoelectric actuator which has properties superior to those of a conventional dielectric film comprised of multi crystal sintering element and has excellent endurance.

Another object of the present invention is to provide an ink jet head having such a piezoelectric actuator and also having a structure suitable for achieving a high density nozzle arrangement and permitting lengthening of the head.

A dielectric film structure according to a first invention is a dielectric film structure having a substrate and a dielectric film provided on the substrate and in which the dielectric film has (001) face orientation with respect to the substrate and in which a value u in the following equation (1) regarding the dielectric film is a real number greater than 2:

$$u=(C_c/C_a)\times(W_a/W_c) \quad (1)$$

where, $C_c$ is a count number (number of counts) of a peak of a (001') face of the dielectric film in an Out-of-plane X ray diffraction measurement (here, l' is a natural number selected so that $C_c$ becomes maximum); $C_a$ is a count number of a peak of a (h'00) face of the dielectric film in an In-plane X ray diffraction measurement (here, h' is a natural number selected so that $C_c$ becomes maximum); $W_c$ is a half-value width of a peak of the (001') face of the dielectric film in an Out-of-plane rocking curve X ray diffraction measurement; and $W_a$ is a half-value width of a peak of the (h'00) face of the dielectric film in an In-plane rocking curve X ray diffraction measurement.

Figure 5:
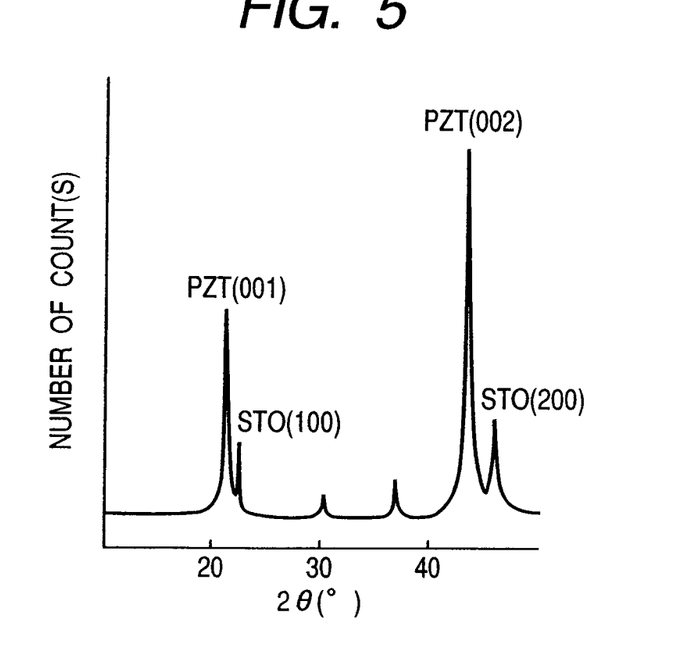
FIG. 5 is a schematic view showing an X ray diffraction measurement chart.
Figure 6:
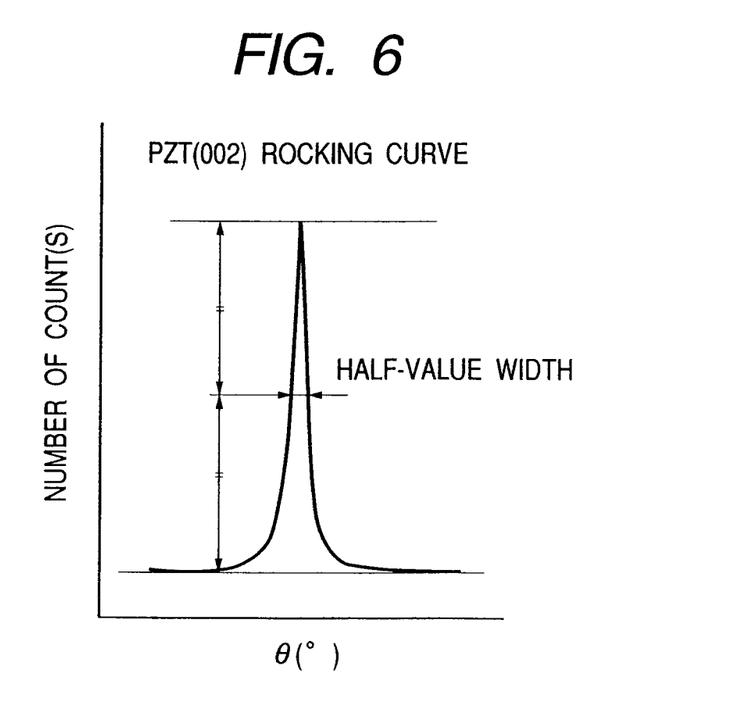
FIG. 6 is a schematic view showing a rocking curve X ray diffraction measurement chart.

Regarding the count number and the half value width in the present invention, the explanation will be made using an example of an X ray diffraction measurement chart (schematic view). For example, if the Out-of-plane X ray diffraction measurement chart of the dielectric film structure according to the first invention is as shown in FIGS. 5 and 6 (rocking curves), $C_c$ is the count number of a PZT (002) peak and $W_c$ is a half-value width of the PZT (002) peak.

The dielectric film of the dielectric film structure according to the first invention is not necessarily provided on the substrate directly, and an intermediate layer (for example, buffer layer or electrode layer) may be included between the dielectric film and the substrate. Further, a plurality of intermediate layers may be provided.

The dielectric film structure according to the first invention achieves the excellent dielectric, piezoelectric, pyroelectric and ferroelectric properties since the dielectric film has the (001) face orientation with respect to the substrate and the crystal structure thereof is controlled so that the value u in the above equation (1) becomes the real number greater than 2, i.e., the crystal structure is controlled in a more preferable manner in a thickness direction of the dielectric film and a direction perpendicular thereto. By using the dielectric film having such a crystalline feature, in these properties, the dielectric film structure having properties superior to those of the conventional multi crystal dielectric film or the conventional dielectric film having (001) face orientation can be obtained. Further, the dielectric film structure according to the first invention has excellent endurance and, thus, even when it is used repeatedly, deterioration of the properties does almost not occur. In the dielectric film structure according to the first invention, preferably, the value u is the real number greater than 3 and, more preferably, the value u is the real number greater than 5, and, most preferably, the value u is the real number greater than 7.

It is preferable that, in the dielectric film having the (001) face orientation according to the first invention, the count number of faces other than the (001) face is smaller than 10% of the count number of the (001') face in the Out-of-plane X ray diffraction measurement and the count number of faces other than the (h00) face is smaller than 10% of the count number of the (h'00) face in the In-plane X ray diffraction measurement. However, h and l are any natural numbers and l' is a natural number selected so that the count number of the peak of the (001') face becomes maximum in the Out-of-plane X ray diffraction measurement and h' is a natural number selected so that the count number of the peak of the (h'00) face becomes maximum in the In-plane X ray diffraction measurement. Preferably, these are smaller than 5% and more preferably smaller than 1%. Incidentally, regarding the (001) face and (h00) faces of the dielectric film in the present invention, when it is assumed that face index of the crystal is (hkl), a face parallel to the surface of the substrate is referred to as the (001) face and a face substantially perpendicular to the surface of the substrate is referred to as the (h00) face.

The dielectric film structure according to the first invention is preferably characterized in that the dielectric film includes three or more of Pb, Zr, Ti, Mg, Zn and Nb. More preferably, the dielectric film mainly includes lead titanate zirconate. With this arrangement, the excellent properties of the dielectric film structure can be achieved in a wide temperature range.

In the dielectric film structure according to the first invention, preferably, a thickness of the dielectric film is greater than 10 nm and smaller than 20 μm. In this construction, by increasing the thickness of the dielectric film, electrical endurance is improved. Further, the structure can be used in a wider voltage range. Further, if the thickness of the dielectric film is too great, the film forming time will be increased. Thus, this is not preferably in the viewpoint of manufacturing efficiency. More preferably, the thickness is greater than 100 nm and smaller than 15 μm and, most preferably, the thickness is greater than 500 nm and smaller than 10 μm.

In the dielectric film structure according to the first invention, preferably, the crystal structure of the dielectric film is square crystal. By using the square crystal, a polarizing direction of the dielectric film can easily be aligned with the thickness direction.

A piezoelectric actuator according to the first invention includes the above-mentioned dielectric film structure according to the first invention. Thus, since the piezoelectric property superior to that of the conventional piezoelectric actuator can be achieved, compactness and high integrating ability of the actuator can be realized.

An ink jet head according to the first invention includes the above-mentioned piezoelectric actuator according to the first invention. Thus, it is possible to achieve high density of the nozzle arrangement and to lengthen the ink jet head (to increase the number of nozzles per one head), with the result that a highly fine image can be obtained by using the ink jet head and a printing speed can be increased.

In the dielectric film of the dielectric film structure according to the first invention, regarding the measurement value in the X ray diffraction, when the value u in the equation $u=(C_c/C_a)\times(W_a/W_c)$ is the real number greater than 2 and preferably greater than 3 and more preferably greater than 5 and greater than 7, the excellent dielectric, piezoelectric, pyroelectric and ferroelectric properties can be achieved. These properties are superior to those of the conventional multi crystal dielectric film or the conventional dielectric film having the (001) face orientation can be obtained. Further, the dielectric film structure has excellent endurance and, thus, even when it is used repeatedly, the deterioration of the properties does almost not occur.

Although a mechanism for realizing the excellent properties of the dielectric film structure of the present invention is not made clear, the following mechanism can be considered. First of all, it is considered that the crystal orientation of the dielectric film is not random unlike to that of the normal multi crystal and is aligned in the thickness direction and in-plane direction. Thus, the function of the dielectric film is not dispersed in various directions but is concentrated in a particular direction, thereby obtaining a great effect.

Next, an arrangement of regularly lined-up crystal grating of the dielectric film of the present invention will be fully considered. Although such grating arrangement is generally lined up regularly, strictly speaking, it is known that the arrangement is not complete but there is slight distortion of crystal orientation. Such distortion is observed as magnitude of a half-value width of a rocking curve in the X ray diffraction measurement. In the dielectric film structure of the present invention, it is considered that the magnitude of the half-value width of the rocking curve of the crystal grating of the dielectric film is greater in the in-plane direction than the thickness direction so that a degree of freedom of the crystal grating is greater in the in-plane direction. As a result, a mechanism in which displacement of constitutional ions in the dielectric crystal, on which the dielectric, piezoelectric, pyroelectric and ferroelectric properties are based, can occur very easily, thereby realizing the excellent properties of the present invention is supposed.

Incidentally, although a condition of the X ray diffraction measurement for seeking the value u in the above equation (1) is not limited to a special one, for example, a measurement condition in which a slit width is 0.2° to 1°, X ray tube voltage is 50 kV and X ray tube current is 40 mA can be used.

A dielectric film structure according to a second invention is a dielectric film structure having a substrate and a dielectric film provided on the substrate and in which the dielectric film has (111) face orientation with respect to the substrate and in which a value v in the following equation (2) regarding the dielectric film is a real number greater than 2:

$$v=(C_{111}/C_{-110})\times(W_{-110}/W_{111}) \quad (2)$$

where, $C_{111}$ is a count number (number of counts) of a peak of a (111) face of the dielectric film in an Out-of-plane X ray diffraction measurement; $C_{-110}$ is a count number of a peak of a (−110) face of the dielectric film in an In-plane X ray diffraction measurement; $W_{111}$ is a half-value width of a peak of the (111) face of the dielectric film in an Out-of-plane rocking curve X ray diffraction measurement; and $W_{-110}$ is a half-value width of a peak of the (−110) face of the dielectric film in an In-plane rocking curve X ray diffraction measurement.

Incidentally, if there are a plurality of reflection peaks of the (−110) face of the In-plane X ray diffraction, $C_{-110}$ and $W_{-110}$ correspond to peaks indicating the maximum count number.

The dielectric film of the dielectric film structure according to the second invention is not necessarily provided on the substrate directly, and an intermediate layer (for example, buffer layer or electrode layer) may be included between the dielectric film and the substrate. Further, a plurality of intermediate layers may be provided.

The dielectric film structure according to the second invention can achieve the excellent dielectric, piezoelectric, pyroelectric and ferroelectric properties since the dielectric film has the (111) face orientation with respect to the substrate and the crystal structure thereof is controlled so that the value v in the above equation (2) becomes the real number greater than 2, i.e., the crystal structure is controlled in a more preferable manner in a thickness direction and a direction perpendicular thereto. By using the dielectric film having such a crystalline feature, in these properties, the dielectric film structure having properties superior to those of the conventional multi crystal dielectric film or the conventional dielectric film having the (111) face orientation can be obtained. Further, the dielectric film structure according to the second invention has excellent endurance and, thus, even when it is used repeatedly, deterioration of the properties does almost not occur. In the dielectric film structure according to the second invention, preferably, the value v is the real number greater than 3 and, more preferably, the value v is the real number greater than 5, and, most preferably, the value v is the real number greater than 7.

It is preferable that, in the dielectric film having the (111) face orientation according to the second invention, the count number of faces not parallel to the (111) face is smaller than 10% of the count number of the (111) face in the Out-of-plane X ray diffraction measurement and the count number of faces not parallel to the {−110} face is smaller than 10% of the count number of the (−110) face in the In-plane X ray diffraction measurement. Preferably, these are both smaller than 5% and more preferably smaller than 1%.

The dielectric film structure according to the second invention is preferably characterized in that the dielectric film includes three or more of Pb, Zr, Ti, Mg, Zn and Nb. More preferably, the dielectric film mainly includes lead titanate zirconate. With this arrangement, the excellent properties of the dielectric film structure can be achieved in a wide temperature range.

In the dielectric film structure according to the second invention, preferably, a thickness of the dielectric film is greater than 10 nm and smaller than 20 μm. In this construction, by increasing the thickness of the dielectric film, electrical endurance is improved. Further, the structure can be used in a wider voltage range. Further, if the thickness of the dielectric film is too great, the film forming time will be increased. Thus, this is not preferably in the viewpoint of manufacturing efficiency. More preferably, the thickness is greater than 100 nm and smaller than 15 μm and, most preferably, the thickness is greater than 500 nm and smaller than 10 μm.

In the dielectric film structure according to the second invention, preferably, the crystal structure of the dielectric film is rhombic crystal. By using the rhombic crystal, a polarizing direction of the dielectric film can easily be aligned with the thickness direction.

A piezoelectric actuator according to the second invention includes the above-mentioned dielectric film structure according to the second invention. Thus, since the piezoelectric property superior to that of the conventional piezoelectric actuator can be achieved, compactness and high integrating ability of the actuator can be realized.

An ink jet head according to the second invention includes the above-mentioned piezoelectric actuator according to the second invention. Thus, it is possible to achieve high density of the nozzle arrangement and to lengthen the ink jet head (to increase the number of nozzles per one head), with the result that a highly fine image can be obtained by using the ink jet head and a printing speed can be increased.

In the dielectric film of the dielectric film structure according to the second invention, regarding the measurement value in the X ray diffraction, when the value v in the equation $v=(C_{111}/C_{-110}) \times (W_{-110}/W_{111})$ is the real number greater than 2 and preferably greater than 3 and more preferably greater than 5 and greater than 7, the excellent dielectric, piezoelectric, pyroelectric and ferroelectric properties are achieved. These properties are superior to those of the conventional multi crystal dielectric film or the conventional dielectric film having (111) face orientation can be obtained. Further, the dielectric film structure has excellent endurance and, thus, even when it is used repeatedly, the deterioration of the properties does almost not occur.

Although a mechanism for realizing the excellent properties of the dielectric film structure of the present invention is not made clear, the following mechanism can be considered. First of all, it is considered that the crystal orientation of the dielectric film structure of the present invention is not random unlike to that of the normal multi crystal and is aligned in the thickness direction and in-plane direction. Thus, the function of the dielectric film is not dispersed in various directions but is concentrated in a particular direction, thereby obtaining a great effect.

Next, an arrangement of regularly lined-up crystal grating of the dielectric film of the present invention will be fully considered. Although such grating arrangement is generally lined up regularly, strictly speaking, it is known that the arrangement is not complete but there is slight distortion of crystal orientation. Such distortion is observed as magnitude of a half-value width of a rocking curve in the X ray diffraction measurement. In the dielectric film structure of the present invention, it is considered that the magnitude of the half-value width of the rocking curve of the crystal grating of the dielectric film is greater in the in-plane direction than the thickness direction so that a degree of freedom of the crystal grating is greater in the in-plane direction. As a result, a mechanism in which displacement of constitutional ions in the dielectric crystal, on which the dielectric, piezoelectric, pyroelectric and ferroelectric properties are based, can occur very easily, thereby realizing the excellent properties of the present invention is supposed.

Incidentally, although a condition of the X ray diffraction measurement for seeking the value v in the above equation (2) is not limited to a special one, for example, a measurement condition in which a slit width is 0.2° to 1°, X ray tube voltage is 50 kV and X ray tube current is 40 mA can be used.

A dielectric film structure according to a third invention is a dielectric film structure having a substrate and a dielectric film provided on the substrate and in which the dielectric film has the (110) face orientation with respect to the substrate and in which a value w in the following equation (3) regarding the dielectric film is a real number greater than 2:

$$w=(C_{110}/C_{00m}) \times (W_{00m}/W_{110}) \quad (3)$$

where, $C_{110}$ is a count number (number of counts) of a peak of a (110) face of the dielectric film in an Out-of-plane X ray diffraction measurement; $C_{00m}$ is a count number of a peak of a (00 m) face of the dielectric film in an In-plane X ray diffraction measurement (here, m is a natural number selected so that $C_{00m}$ becomes maximum); $W_{110}$ is a half-value width of a peak of the (110) face of the dielectric film in an Out-of-plane rocking curve X ray diffraction measurement; and $W_{00m}$ is a half-value width of a peak of the (00 m) face of the dielectric film in an In-plane rocking curve X ray diffraction measurement.

The dielectric film of the dielectric film structure according to the third invention is not necessarily provided on the substrate directly, and an intermediate layer (for example, buffer layer or electrode layer) may be included between the dielectric film and the substrate. Further, a plurality of intermediate layers may be provided.

The dielectric film structure according to the third invention can achieve the excellent dielectric, piezoelectric, pyroelectric and ferroelectric properties since the dielectric film has the (110) face orientation with respect to the substrate and the crystal structure thereof is controlled so that the value w in the above equation (3) becomes the real number greater than 2, i.e., the crystal structure is controlled in a more preferable manner in a thickness direction and a direction perpendicular thereto. By using the dielectric film having such a crystalline feature, in these properties, the dielectric film structure having properties superior to those of the conventional multi crystal dielectric film or the conventional dielectric film having the (110) face orientation can be obtained. Further, the dielectric film structure according to the third invention has excellent endurance and, thus, even when it is used repeatedly, deterioration of the properties does almost not occur. In the dielectric film structure according to the third invention, preferably, the value w is the real number greater than 3 and, more preferably, the value w is the real number greater than 5, and, most preferably, the value w is the real number greater than 7.

It is preferable that, in the dielectric film having the (110) face orientation according to the third invention, the count number of faces not parallel to the (110) face is smaller than 10% of the count number of the (110) face in the Out-of-plane X ray diffraction measurement and the count number of faces not parallel to the {−110} face is smaller than 10% of the count number of the (−110) face in the In-plane X ray diffraction measurement. Preferably, these are both smaller than 5% and more preferably smaller than 1%.

The dielectric film structure according to the third invention is preferably characterized in that the dielectric film includes three or more of Pb, Zr, Ti, Mg, Zn and Nb. More preferably, the dielectric film mainly includes lead titanate zirconate. With this arrangement, the excellent properties of the dielectric film structure can be achieved in a wide temperature range.

In the dielectric film structure according to the third invention, preferably, a thickness of the dielectric film is greater than 10 nm and smaller than 20 μm. In this construction, by increasing the thickness of the dielectric film, electrical endurance is improved. Further, the structure can be used in a wider voltage range. Further, if the thickness of the dielectric film is too great, the film forming time will be increased. Thus, this is not preferably in the viewpoint of manufacturing efficiency. More preferably, the thickness is greater than 100 nm and smaller than 15 μm and, most preferably, the thickness is greater than 500 nm and smaller than 10 μm.

A piezoelectric actuator according to the third invention includes the above-mentioned dielectric film structure according to the third invention. Thus, since the piezoelectric property superior to that of the conventional piezoelectric actuator can be achieved, compactness and high integrating ability of the actuator can be realized.

An ink jet head according to the third invention includes the above-mentioned piezoelectric actuator according to the third invention. Thus, it is possible to achieve high density of the nozzle arrangement and to lengthen the ink jet head (to increase the number of nozzles per one head), with the result that a highly fine image can be obtained by using the ink jet head and a printing speed can be increased.

In the dielectric film of the dielectric film structure according to the third invention, regarding the measurement value in the X ray diffraction, when the value w in the equation $w=(C_{110}/C_{00m})\times(W_{00m}/W_{110})$ is the real number greater than 2 and preferably greater than 3 and more preferably greater than 5 and greater than 7, the excellent dielectric, piezoelectric, pyroelectric and ferroelectric properties are achieved. These properties are superior to those of the conventional multi crystal dielectric film or the conventional dielectric film having the (110) face orientation can be obtained. Further, the dielectric film structure has excellent endurance and, thus, even when it is used repeatedly, the deterioration of the properties does almost not occur.

Although a mechanism for realizing the excellent properties of the dielectric film structure of the present invention is not made clear, the following mechanism can be considered. First of all, it is considered that the crystal orientation of the dielectric film structure of the present invention is not random unlike to that of the normal multi crystal and is aligned in the thickness direction and in-plane direction. Thus, the function of the dielectric film is not dispersed in various directions but is concentrated in a particular direction, thereby obtaining a great effect.

Next, an arrangement of regularly lined-up crystal grating of the dielectric film of the present invention will be fully considered. Although such grating arrangement is generally lined up regularly, strictly speaking, it is known that the arrangement is not complete but there is slight distortion of crystal orientation. Such distortion is observed as magnitude of a half-value width of a rocking curve in the X ray diffraction measurement. In the dielectric film structure of the present invention, it is considered that the magnitude of the half-value width of the rocking curve of the crystal grating of the dielectric film is greater in the in-plane direction than the thickness direction so that a degree of freedom of the crystal grating is greater in the in-plane direction. As a result, a mechanism in which displacement of constitutional ions in the dielectric crystal, on which the dielectric, piezoelectric, pyroelectric and ferroelectric properties are based, can occur very easily, thereby realizing the excellent properties of the present invention is supposed.

Incidentally, although a condition of the X ray diffraction measurement for seeking the value w in the above equation (3) is not limited specially, for example, a measurement condition in which a slit width is 0.2° to 1°, X ray tube voltage is 50 kV and X ray tube current is 40 mA can be used.

Since such a dielectric film structure of the present invention has the excellent dielectric, piezoelectric, pyroelectric and ferroelectric properties, compactness and a high integrating ability of an element such as an actuator, a memory and a sensor can be achieved.

Further, the piezoelectric actuator of the present invention has both excellent piezoelectric property and endurance, so that the excellent piezoelectric property can be maintained for a long term.

Furthermore, since the ink jet head of the present invention includes the above-mentioned piezoelectric actuator, the head provides excellent ink discharging ability and endurance and a lengthened ink jet head having a high density nozzle arrangement can be provided.

DESCRIPTION OF THE PREFERRED EMBODIMENTS

Although a method for forming a dielectric film of the present invention is not limited specially, a method such as a spattering method, a deposition method, a laser abrasion method, a MOCVD method, a molecular beam epitaxy method, a sol-gel method or an ion plating method can be used, and manufacturing conditions for obtaining a crystal structure in which the value u in the above equation (1), the value v in the above equation (2) and the value w in the above equation (3) become predetermined values are set. As for film forming conditions in the spattering method, a substrate temperature in film formation is greater than 500° C. and smaller than 700° C., a ratio of argon/oxygen within an oxygen atmosphere is greater than 20/1 and smaller than 50/1, a gas pressure is greater than 0.2 Pa and smaller than 0.5 Pa, an RF applied electric power is greater than 0.5 W/cm$^2$ and smaller than 1.2 W/cm$^2$, and a substrate cooling speed after film formation is greater than 65° C./min. More preferably, the ratio of argon/oxygen in the film formation is greater than 30/1 and smaller than 50/1, the gas pressure is greater than 0.2 Pa and 0.3 Pa, the RF applied electric power is greater than 0.5 W/cm$^2$ and smaller than 0.8 W/cm$^2$, and the substrate cooling speed after the film formation is greater than 100° C./min. Particularly, the cooling up to 180° C. is preferably performed at the above-mentioned speed and, further, it is preferable that pre-spattering performed prior to the film formation is performed shortly at an electric power smaller than a half of the RF applied electric power during the film formation and the pre-spattering is shifted to the film formation promptly. In dependence upon the formation of the desired dielectric film, conditions can be selected appropriately from the above-mentioned conditions to form the film. Particularly, in a system in which dopant such as La is added, the substrate temperature can be reduced and the RF applied electric power can be set to be higher. It is preferable that the substrate is heated by an infrared heating method or a resistance heating method. In this case, by suppressing dispersion in the substrate temperature within ±5%, even when the dielectric film is formed by using a substrate having a large area, a dielectric film having uniform and stable properties can be obtained.

Although a material constituting the dielectric film of the present invention is not limited to a special one so long as the crystal structure in which the value u in the above equation (1), the value v in the above equation (2) and the value w in the above equation (3) become predetermined values, preferably, such material may be barium titanate ($BaTiO_3$), lead titanate ($PbTiO_3$, PT), lead titanate zirconate (Pb(Zr, Ti)$O_3$, PZT), lanthanum titanate, lead zinc niobate (Pb($Zn_{1/3}Nb_{2/3}$)$O_3$, PZN), lead magnesium niobate (Pb($Mg_{1/3}Nb_{2/3}$)$O_3$, PMN), lead nickel niobate (Pb($Ni_{1/3}Nb_{2/3}$)$O_3$, PNN), potassium niobate ($KNbO_3$, KN), lithium niobate ($LiNbO_3$, LN) or solid solution thereof (for example, PMN-PT solid solution, PZN-PT solid solution or PNN-PT solid solution). More preferably, such material mainly includes lead titanate zirconate.

In the dielectric film, for the purpose of reforming of material, a small amount of additive may be added, constitutional element may be replaced by other element or other component may be solid-solved. Although such amounts are not limited specially, as preferable amounts, the small amount of additive is smaller than 10 mass %, the element substituted for the constitutional element is smaller than 10 moles and the component solid-solved is smaller than 10 mole % of the total components.

Although these other components are not limited to a special one so long as the objects of the present invention can be achieved, preferably, such a component may be element (ion) such as Na, K, Ca, Cr, Co, Bi, Sr, La, Zr, Sn, Mg, Mn, Zn, Nb, Ta or Ni, or oxide or composite oxide including such a component.

The dielectric film structure of the present invention may include electrodes as a constitutional part and, by adopting an arrangement in which the dielectric film is disposed between a pair of electrodes opposed with a predetermined gap therebetween, an element such as a piezoelectric element can be obtained. Although material of the electrode is not limited to a special one, it may be metal such as platinum, iridium, ruthenium, palladium, rhodium, osmium, gold, silver, copper, chromium or aluminum. Particularly, in a case where other layer such as a dielectric film is epitaxial-grown on the electrode, platinum is preferable. Further, conductive oxide may be used as the electrode material.

In the present invention, in a case where a plurality of elements is lined up, one of the pair of electrodes can be used as a common electrode for the plurality of elements.

Although the substrate used in the present invention is not limited to a special one so long as it can bear the manufacturing condition, preferably, the substrate may be formed from a material such as silicon, strontium titanate ($S_rT_yO_3$), magnesium oxide (MgO), zirconium oxide ($ZrO_2$), stabilized zirconium oxide, gallium phosphorus, sapphire ($\alpha$-$Al_2O_3$) or lead titanate. Particularly, the silicon substrate is preferable in the view point of fine working. Further, the above-mentioned material may be laminated on the silicon substrate. In this case, a layer formed from silicon oxide or silicon nitrate may be provided as an intermediate layer.

In a piezoelectric actuator according to the present invention, the dielectric film is disposed between the pair of electrodes having the above-mentioned construction on a vibrating plate. The vibrating plate can be formed as at least a part of the substrate supporting the dielectric film or as a film separately laminated on the substrate. As a material of the separately laminated layer, a material capable of forming a surface of the substrate can be used.

An ink jet head according to the present invention includes liquid discharge ports and discharge pressure generating elements for discharging the liquid from the discharge ports, and the above-mentioned piezoelectric actuators are used as the discharge pressure generating elements. The liquid is selected from among various liquids, and ink is used for recording.

Embodiments 1 to 5

Figure 1A:
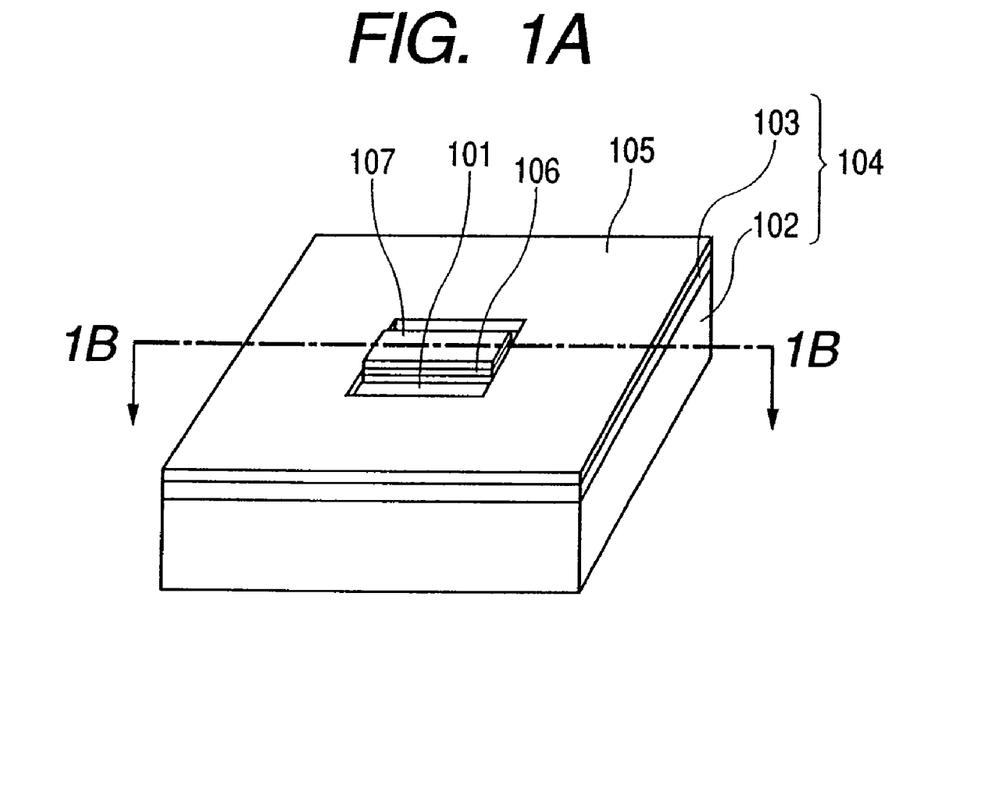
FIG. 1A is a perspective view of a piezoelectric actuator of both-lever type according to the present invention and FIG. 1B is a sectional view of the piezoelectric actuator of both-lever type of the present invention, taken along the line 1B-1B in FIG. 1A.
Figure 1B:
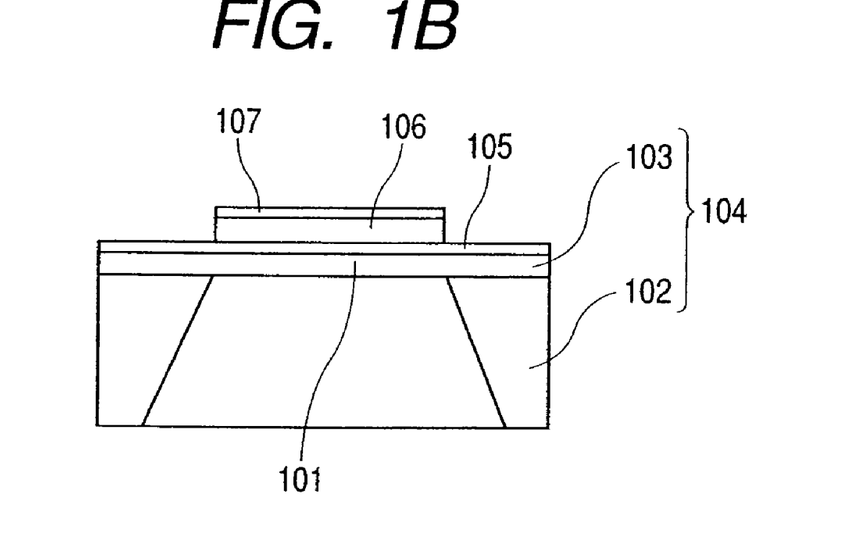

As the dielectric film structures for embodiments 1 to 5, a piezoelectric actuator of both-lever type shown in FIGS. 1A and 1B was manufactured. FIG. 1A is a perspective view of the piezoelectric actuator of both-lever type according to the present invention and FIG. 1B is a sectional view taken along the line 1B-1B in FIG. 1A. Regarding a dimension of a beam (lever) 101, a width is 100 µm and a length is 800 µm.

First of all, a mask was provided on a (100) silicon substrate 102 so that a pattern of the beams can be formed and strontium titanate having (100) face orientation and having a thickness of 700 nm to 4000 nm was film-formed by a spattering method, thereby obtaining a vibrating plate 103. The reference numeral 104 indicates a substrate of the dielectric film structure of the present invention. A mask was similarly provided on this substrate and platinum having (100) face orientation was epitaxial-grown by a spattering method, thereby forming a lower electrode 105 having a thickness of about 100 nm. A mask for patterning was provided thereon and orientation of the crystal structure was controlled by appropriately adjusting atmosphere and a substrate temperature during the film formation and a cooling condition after the film formation in correspondence to the composition of lead titanate zirconate (PZT) by means of an RF magnetron spattering method and a dielectric film 106 was formed by epitaxial-growing in (100) face orientation. Regarding the film forming condition in this case, a substrate temperature was 600° C. to 650° C., a ratio of argon/oxygen in the firm formation was 25/1 to 30/1, gas pressure was 0.2 Pa and an RF applied electric power in the film formation was 0.8 W/$cm^2$, and a cooling speed after the film formation was controlled at a rate greater than 100° C./min until the temperature reaches below 180° C., and the pre-spattering prior to the film formation was performed for 3 minutes at an RF applied electric power of 0.3 W/$cm^2$. Film thicknesses of the dielectric films and element ratios between zirconium and titanium are shown in the following Table 2. The composition analysis of the dielectric film was performed by using an ICP (plasma light emitting) method.

Further, Out-of-plane and In-plane X ray diffraction measurements were performed regarding the dielectric films. In all of the embodiments 1 to 5, it was found that a peak of the maximum count number of the dielectric film in the Out-of-plane X ray diffraction measurement was a peak of a (002) face. Here, it is assumed that a maximum count number of a peak among peaks of faces not parallel to the (002) face is $C_{nc}$ and a count number of a maximum peak among peaks of faces not parallel to a (200) face in the In-plane X ray diffraction measurement is $C_{na}$. In the Out-of-plane X ray diffraction measurement according to all of the embodiments 1 to 5, it was found that $C_{nc}$ is smaller than 10% of $C_c$ (here, a count number of the peak of the (002) face). In the In-plane X ray diffraction measurements according to all of the embodiments 1 to 5, it was found that $C_{na}$ is smaller than 10% of $C_a$ (here, a count number of the peak of the (200) face). Details regarding ratios of the count numbers $C_{nc}/C_c$ and $C_{na}/C_a$ are shown in the Table 2. Further, $C_c$, $W_c$, $C_a$, $W_a$ and u are shown in the following Table 1.

Further, an upper electrode 107 was formed by film-forming platinum having a thickness of about 100 nm on the dielectric film by means of a spattering method. Lastly, silicon on lower portions of the beams was removed by anisotropy etching, thereby completing an actuator of both-lever type.

Endurance tests for repeated displacement were performed by $10^7$ times by applying voltage between the upper electrode and the lower electrode of this actuator. Applied voltages, initial displacements, displacement amounts after $10^7$ times endurance test and reduction ratios of the displacement amount after $10^7$ times endurance test with respect to the initial displacement amount in this case are shown in the Table 2.

Comparative Example 1

Figure 3A:
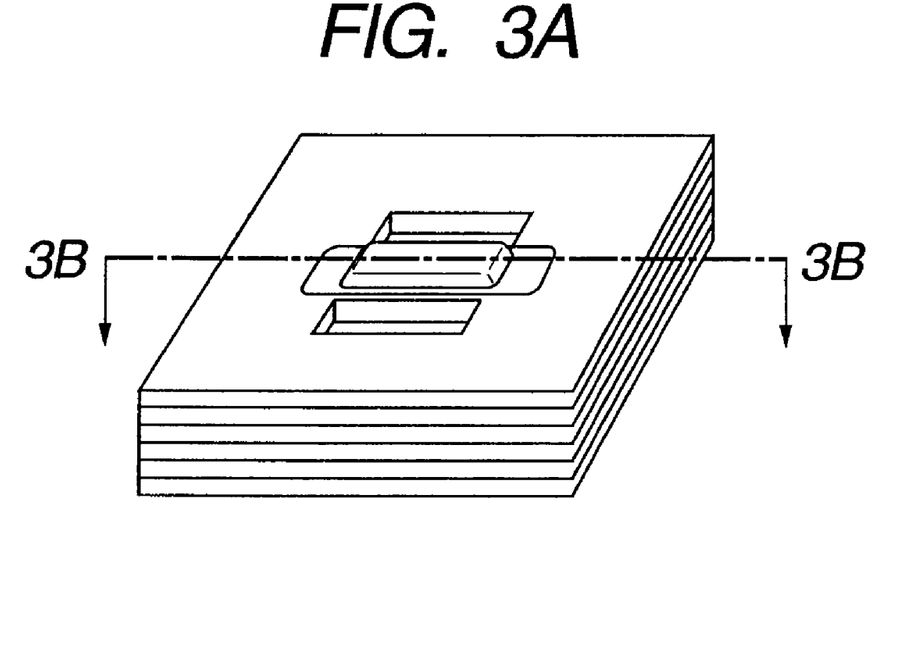
FIG. 3A is a perspective view of a piezoelectric actuator of both-lever type using piezoelectric ceramic paste and FIG. 3B is a sectional view of the piezoelectric actuator of both-lever type using the piezoelectric ceramic paste, taken along the line 3B-3B in FIG. 3A.
Figure 3B:
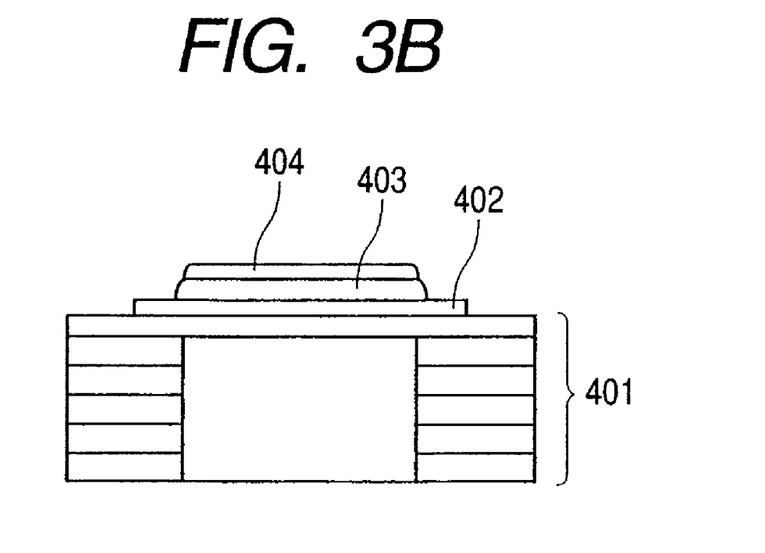

Piezoelectric actuators of both-lever type shown in FIGS. 3A and 3B were manufactured as follows. After green sheets of stabilized zirconium oxide obtained by punching working were laminated, heating was performed to bond them together, thereby forming a both-lever beam having a width of 200 μm and a length of 800 μm. This was used as a substrate 401 and, after electrode paste including platinum was screen-printed on the beam, it was dried thereby to form a lower electrode 402. After piezoelectric ceramic paste of lead titanate zirconate (PZT) was coated on the lower electrode by a screen printing, it was dried thereby to form a dielectric film 403. After electrode paste including platinum was screen-printed on the dielectric film, it was dried thereby to form an upper electrode 404. A structure comprised of the obtained substrate, lower electrode, dielectric film and upper electrode was simultaneously burned to complete an actuator of both-lever type. As a result of X ray diffraction measurement, it was found that the dielectric film is multi crystal having no orientation. Film thicknesses of the dielectric film and element ratios between zirconium and titanium are shown in the following Table 4.

Similar to the above embodiments, endurance tests for $10^7$ times repeated displacement were performed by using such actuators. Applied voltages, initial displacements, displacement amounts after $10^7$ times endurance test and reduction ratios of the displacement amount after $10^7$ times endurance test with respect to the initial displacement amount in this case are shown in the Table 4.

Comparative Examples 2 to 7

Similar to processes in the embodiment 1, piezoelectric actuators of both-lever type were manufactured by adjusting atmosphere and substrate temperature during the formation of the dielectric film and a cooling condition after the film formation. Incidentally, when the dielectric film was formed, the cooling speed after the film formation was not controlled regarding a temperature smaller than 400° C. and the pre-spattering was performed for 60 minutes at an electric power same as the RF applied electric power during the film formation. As a result of the X ray diffraction measurement, it was found that, particularly regarding dielectric film of the comparative example 2, peaks other than a (00h) face become notable in the Out-of-plane measurement and the dielectric film is multi crystal having low (001) face orientation. Film thicknesses of the dielectric film and element ratios between zirconium and titanium are shown in the Table 4. Results of Out-of-plane and In-plane X ray diffraction measurements are shown in the following Tables 3 and 4.

Endurance tests for repeated displacement were performed by $10^7$ times by using such actuators. Applied voltages, initial displacements, displacement amounts after $10^7$ times endurance test and reduction ratios of the displacement amount after $10^7$ times endurance test with respect to the initial displacement amount in this case are shown in the Table 4.

Embodiment 6

A lower electrode was formed by epitaxial-growing platinum having (100) face orientation and a thickness of 10 nm on a (100) substrate of strontium titanate by means of a spattering method. Lead titanate zirconate having a thickness of 10 nm and (100) face orientation was epitaxial-grown on the lower electrode by an RF magnetron spattering method under the above-mentioned condition, thereby forming a dielectric film having a thickness of 10 nm. Film thicknesses of the dielectric film, element ratios between zirconium and titanium and a result of the X ray diffraction measurement are shown in the following Table 5. Platinum having a thickness of 10 nm was film-formed on the dielectric film by a spattering method thereby to form an upper electrode, thereby completing a dielectric film structure. An endurance test was performed by using such a dielectric film structure. Voltage was applied up to maximum voltage of 1V. However, leak was not generated and there is no problem regarding endurance.

Embodiment 7

Figure 2A:
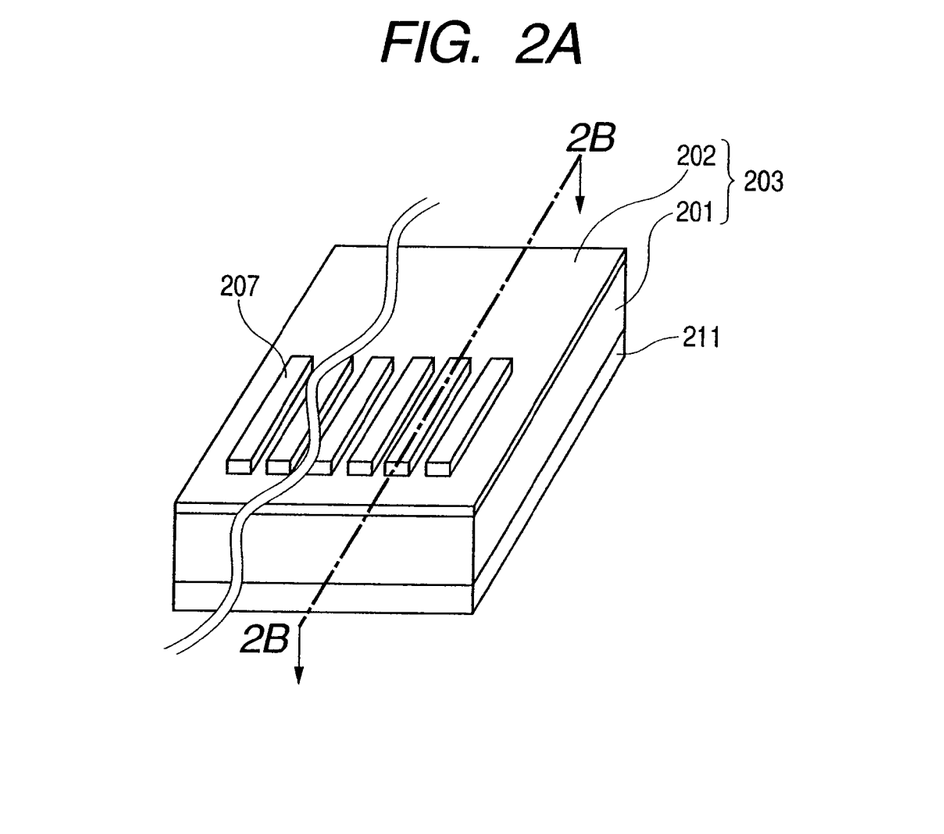
FIG. 2A is a perspective view of an ink jet head according to the present invention and FIG. 2B is a sectional view of the ink jet head of the present invention, taken along the line 2B-2B in FIG. 2A.
Figure 2B:
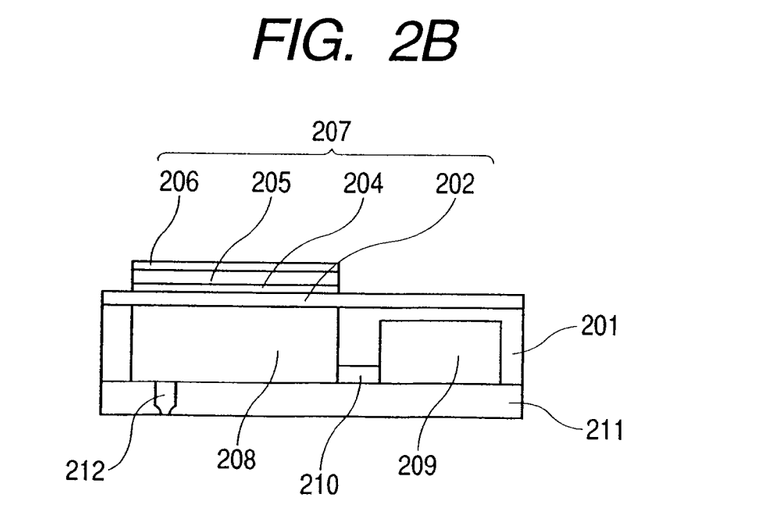

An ink jet head shown in FIGS. 2A and 2B was manufactured as follows. FIG. 2A is a perspective view showing an example of an ink jet head of the present invention and FIG. 2B is a sectional view taken along the line 2B-2B in FIG. 2A.

A strontium titanate layer having (100) face orientation and a thickness of about 2000 nm was film-formed on a (100) silicon substrate constituting a flow path substrate 201, thereby forming a vibrating plate 202. This plate was used as a substrate 203 of the dielectric film structure of the present invention. A mask was patterned on the strontium titanate layer in correspondence to positions where ink pressurizing chambers 208 are to be formed and platinum having (100) face orientation was epitaxial-grown by a spattering method, thereby forming a lower electrode 204 having a thickness of about 100 nm. A mask having a width of 100 μm and a length of 5 mm was patterned on the lower electrode 204 and a dielectric film 205 of 0.9 PZT-0.1 PMN solid solution having (001) face orientation was epitaxial-grown by an RF magnetron spattering method under the above-mentioned film forming conditions, thereby forming 200 dielectric films at a pitch of 200 dpi in a width-wise direction. A film thickness of the dielectric film, an element ratio between zirconium and titanium and a result of the X ray diffraction measurement are shown in the following Table 6. Further, platinum having a thickness of about 100 nm was film-formed on the dielectric film by a spattering method, thereby forming an upper electrode 206.

Ink pressurizing chambers 208, a common ink chamber 209, communication paths 210 connecting between the ink pressurizing chambers and the common ink chamber and a communication path (not shown) connecting between the common ink chamber and an ink tank were formed by reactive ion etching (RIE) from a lower side of the flow path substrate 201. Then, nozzles 212 were formed in another silicon substrate 211 at a pitch of 200 dpi by reactive ion etching (RIE) in correspondence to the respective ink pressurizing chambers 208, thereby forming a nozzle plate 211. The flow path substrate 201 and the nozzle plate 211 were joined together as shown in FIGS. 2A and 2B, thereby completing an ink jet head.

A discharging test was performed by using this ink jet head. It was found that an ink droplet of 10 pl can be discharged at a discharging speed of 14.5 m/sec and it was ascertained that an adequate discharging speed can be obtained.

Embodiments 8 to 12

As the dielectric film structures for embodiments 8 to 12, a piezoelectric actuator of both-lever type shown in FIGS. 1A and 1B was manufactured as follows. FIG. 1A is a perspective view of the piezoelectric actuator of both-lever type according to the present invention and FIG. 1B is a sectional view taken along the line 1B-1B in FIG. 1A. Regarding a dimension of a beam (lever) 101, a width is 100 μm and a length is 800 μm.

First of all, a mask was provided on a (100) silicon substrate 102 so that a pattern of the beams can be formed and strontium titanate having (111) face orientation and having a thickness of 700 nm to 4000 nm was film-formed by a spattering method, thereby obtaining a vibrating plate 103. The reference numeral 104 indicates a substrate of the dielectric film structure of the present invention. A mask was similarly provided on this substrate and platinum having (111) face orientation was epitaxial-grown by a spattering method, thereby forming a lower electrode 105 having a thickness of about 100 nm. A mask for patterning was provided thereon and orientation of the crystal structure was controlled by appropriately adjusting atmosphere and a substrate temperature during the film formation and a cooling condition after the film formation in correspondence to the composition of lead titanate zirconate (PZT) by means of an RF magnetron spattering method and a dielectric film 106 was formed by epitaxial-growing in (111) face orientation. Regarding the film forming condition in this case, a substrate temperature was 600° C. to 650° C., a ratio of argon/oxygen in the film formation was 25/1 to 30/1, gas pressure was 0.2 Pa and an RF applied electric power in the film formation was 0.8 W/cm$^2$, and a cooling speed after the film formation was controlled at a rate greater than 100° C./min until the temperature reaches below 180° C., and the pre-spattering prior to the film formation was performed for 3 minutes at an RF applied electric power of 0.3 W/cm$^2$. Film thicknesses of the dielectric films and element ratios between zirconium and titanium are shown in the following Table 8. The composition analysis of the dielectric film was performed by using an ICP (plasma light emitting) method.

Further, Out-of-plane and In-plane X ray diffraction measurements were performed regarding the dielectric films. In all of the embodiments 8 to 12, it was found that a peak of the maximum count number of the dielectric film in the Out-of-plane X ray diffraction measurement was a peak of a (111) face. Here, it is assumed that a maximum count number of a peak among peaks of faces not parallel to the (111) face is $C_{n111}$ and a count number of a maximum peak among peaks of faces not parallel to a {−110} face in the In-plane X ray diffraction measurement is $C_{n-110}$. In the Out-of-plane X ray diffraction measurement according to all of the embodiments 8 to 12, it was found that $C_{n111}$ is smaller than 10% of $C_{111}$. In the In-plane X ray diffraction measurements according to all of the embodiments 8 to 12, it was found that $C_{n-110}$ is smaller than 10% of $C_{-110}$. Details regarding ratios of the count numbers $C_{n111}/C_{111}$ and $C_{n-110}/C_{-110}$ are shown in the Table 8. Further, $C_{111}$, $W_{111}$, $C_{-110}$, $W_{-110}$ and v are shown in the following Table 7.

Further, an upper electrode 107 was formed by film-forming platinum having a thickness of about 100 nm on the dielectric film by means of a spattering method. Lastly, silicon on lower portions of the beams was removed by anisotropy etching, thereby completing an actuator of both-lever type.

Endurance tests for repeated displacement were performed by 10$^7$ times by using such actuators. Applied voltages, initial displacements, displacement amounts after 10$^7$ times endurance test and reduction ratios of the displacement amount after 10$^7$ times endurance test with respect to the initial displacement amount in this case are shown in the Table 8.

Comparative Examples 8 to 13

Similar to processes in the embodiment 8, piezoelectric actuators of both-lever type for comparative examples 8 to 13 were manufactured by adjusting atmosphere and substrate temperature during the formation of the dielectric film and a cooling condition after the film formation. Incidentally, when the dielectric film was formed, the cooling speed after the film formation was not controlled regarding a temperature smaller than 400° C. and the pre-spattering was performed for 60 minutes at an electric power same as the RF applied electric power during the film formation. As a result of the X ray diffraction measurement, it was found that, particularly regarding dielectric film of the comparative example 9, peaks other than a (111) face become notable in the Out-of-plane measurement and the dielectric film is multi crystal having low (111) face orientation. Film thicknesses of the dielectric film and element ratios between zirconium and titanium are shown in the following Table 10. Results of Out-of-plane and In-plane X ray diffraction measurements are shown in the following Tables 9 and 10.

Endurance tests for repeated displacement were performed by 10$^7$ times by using such actuators. Applied voltages, initial displacements, displacement amounts after 10$^7$ times endurance test and reduction ratios of the displacement amount after 10$^7$ times endurance test with respect to the initial displacement amount in this case are shown in the Table 10.

Embodiment 13

A lower electrode was formed by epitaxial-growing platinum having (111) face orientation and a thickness of 10 nm on a (111) substrate of strontium titanate by means of a spattering method. Lead titanate zirconate having a thickness of 10 nm and (111) face orientation was epitaxial-grown on the lower electrode by an RF magnetron spattering method under the above-mentioned condition, thereby forming a dielectric film having a thickness of 10 nm. A film thickness of the dielectric film, an element ratio between zirconium and titanium and a result of the X ray diffraction measurement are shown in the following Table 11. Platinum having a thickness of 10 nm was film-formed on the dielectric film by a spattering method thereby to form an upper electrode, thereby completing a dielectric film structure. An endurance test was performed by using such a dielectric film structure. Voltage was applied up to maximum voltage of 1V. However, leak was not generated and there is no problem regarding endurance.

Embodiment 14

An ink jet head shown in FIGS. 2A and 2B was manufactured as follows. FIG. 2A is a perspective view showing an example of an ink jet head of the present invention and FIG. 2B is a sectional view taken along the line 2B-2B in FIG. 2A.

A strontium titanate layer having (111) face orientation and a thickness of about 2000 nm was film-formed on a (100) silicon substrate constituting a flow path substrate 201, thereby forming a vibrating plate 202. This plate was used as a substrate 203 of the dielectric film structure of the present invention. A mask was patterned on the strontium titanate layer in correspondence to positions where ink pressurizing chambers 208 are to be formed and platinum having (111) face orientation was epitaxial-grown by a sputtering method, thereby forming a lower electrode 204 having a thickness of about 100 nm. A mask having a width of 100 μm and a length of 5 mm was patterned on the lower electrode 204 and a dielectric film 205 of 0.9 PZT-0.1 PMN solid solution having (111) face orientation was epitaxial-grown by an RF magnetron sputtering method under the above-mentioned film forming conditions, thereby forming 200 dielectric films at a pitch of 200 dpi in a width-wise direction. A film thickness of the dielectric film, an element ratio between zirconium and titanium and a result of the X ray diffraction measurement are shown in the following Table 12. Further, platinum having a thickness of about 100 nm was film-formed on the dielectric film by a sputtering method, thereby forming an upper electrode 206.

Ink pressurizing chambers 208, a common ink chamber 209, communication paths 210 connecting between the ink pressurizing chambers and the common ink chamber and a communication path (not shown) connecting between the common ink chamber and an ink tank were formed by reactive ion etching (RIE) from a lower side of the flow path substrate 201. Then, nozzles 212 were formed in another silicon substrate 211 at a pitch of 200 dpi by reactive ion etching (RIE) in correspondence to the respective ink pressurizing chambers 208, thereby forming a nozzle plate 211. The flow path substrate 201 and the nozzle plate 211 were joined together as shown in FIGS. 2A and 2B, thereby completing an ink jet head.

A discharging test was performed by using this ink jet head. It was found that an ink droplet of 12 pl can be discharged at a discharging speed of 16.1 m/sec and it was ascertained that an adequate discharging speed can be obtained.

Embodiments 15 to 19

As the dielectric film structures for embodiments 15 to 19, a piezoelectric actuator of both-lever type shown in FIGS. 1A and 1B was manufactured as follows. FIG. 1A is a perspective view of the piezoelectric actuator of both-lever type according to the present invention and FIG. 1B is a sectional view taken along the line 1B-1B in FIG. 1A. Regarding a dimension of a beam (lever) 101, a width is 100 μm and a length is 800 μm.

First of all, a mask was provided on a (100) silicon substrate 102 so that a pattern of the beams can be formed and strontium titanate having (110) face orientation and having a thickness of 700 nm to 4000 nm was film-formed by a sputtering method, thereby obtaining a vibrating plate 103. The reference numeral 104 indicates a substrate of the dielectric film structure of the present invention. A mask was similarly provided on this substrate and platinum having (110) face orientation was epitaxial-grown by a sputtering method, thereby forming a lower electrode 105 having a thickness of about 100 nm. A mask for patterning was provided thereon and orientation of the crystal structure was controlled by appropriately adjusting atmosphere and a substrate temperature during the film formation and a cooling condition after the film formation in correspondence to the composition of lead titanate zirconate (PZT) by means of an RF magnetron sputtering method and a dielectric film 106 was formed by epitaxial-growing in (110) face orientation. Regarding the film forming condition in this case, a substrate temperature was 600° C. to 650° C., a ratio of argon/oxygen in the film formation was 25/1 to 30/1, gas pressure was 0.2 Pa and an RF applied electric power in the film formation was 0.8 W/cm², and a cooling speed after the film formation was controlled at a rate greater than 100° C./min until the temperature reaches below 180° C., and the pre-sputtering prior to the film formation was performed for 3 minutes at an RF applied electric power of 0.3 W/cm². Film thicknesses of the dielectric films and element ratios between zirconium and titanium are shown in the following Table 14. The composition analysis of the dielectric film was performed by using an ICP (plasma light emitting) method.

Further, Out-of-plane and In-plane X ray diffraction measurements were performed regarding the dielectric films. In all of the embodiments 15 to 19, it was found that a peak of the maximum count number of the dielectric film in the Out-of-plane X ray diffraction measurement was a peak of a (110) face. Here, it is assumed that a maximum count number of a peak among peaks of faces not parallel to the (110) face is $C_{n110}$ and a count number of a maximum peak among peaks of faces not parallel to a (001) face in the In-plane X ray diffraction measurement is $C_{n001}$. In the Out-of-plane X ray diffraction measurement according to all of the embodiments 15 to 19, it was found that $C_{n110}$ is smaller than 10% of $C_{110}$. In the In-plane X ray diffraction measurements according to all of the embodiments 15 to 19, it was found that $C_{n001}$ is smaller than 10% of $C_{001}$. Details regarding ratios of the count numbers $C_{n110}/C_{110}$ and $C_{n001}/C_{001}$ are shown in the Table 14. Further, $C_{110}$, $W_{110}$, $C_{001}$, $W_{001}$ and w are shown in the following Table 13.

Further, an upper electrode 107 was formed by film-forming platinum having a thickness of about 100 nm on the dielectric film by means of a sputtering method. Lastly, silicon on lower portions of the beams was removed by anisotropy etching, thereby completing an actuator of both-lever type.

Endurance tests for repeated displacement were performed by $10^7$ times by using such actuators. Applied voltages, initial displacements, displacement amounts after $10^7$ times endurance test and reduction ratios of the displacement amount after $10^7$ times endurance test with respect to the initial displacement amount in this case are shown in the Table 14.

Comparative Examples 14 to 16

Similar to processes in the embodiment 15, piezoelectric actuators of both-lever type for comparative examples 14 to 16 were manufactured by adjusting atmosphere and substrate temperature during the formation of the dielectric film and a cooling condition after the film formation. Incidentally, when the dielectric film was formed, the cooling speed after the film formation was not controlled regarding a temperature smaller than 400° C. and the pre-sputtering was performed for 60 minutes at an electric power same as the RF applied electric power during the film formation. Film thicknesses of the dielectric films and element ratios between zirconium and titanium are shown in the following Table 16. Results of Out-of-plane and In-plane X ray diffraction measurements are shown in the following Tables 15 and 16.

Endurance tests for repeated displacement were performed by $10^7$ times by using such actuators. Applied voltages, initial displacements, displacement amounts after $10^7$ times endurance test and reduction ratios of the displacement amount after $10^7$ times endurance test with respect to the initial displacement amount in this case are shown in the Table 16.

Embodiment 20

A lower electrode was formed by epitaxial-growing platinum having (110) face orientation and a thickness of 10 nm on a (110) substrate of strontium titanate by means of a spattering method. Lead titanate zirconate having a thickness of 10 nm and (110) face orientation was epitaxial-grown on the lower electrode by an RF magnetron spattering method under the above-mentioned condition, thereby forming a dielectric film having a thickness of 10 nm. A film thickness of the dielectric film, an element ratio between zirconium and titanium and a result of the X ray diffraction measurement are shown in the following Table 17. Platinum having a thickness of 10 nm was film-formed on the dielectric film by a spattering method thereby to form an upper electrode, thereby completing a dielectric film structure. An endurance test was performed by using such a dielectric film structure. Voltage was applied up to maximum voltage of 1V. However, leak was not generated and there is no problem regarding endurance.

Embodiment 21

An ink jet head shown in FIGS. 2A and 2B was manufactured as follows. FIG. 2A is a perspective view showing an example of an ink jet head of the present invention and FIG. 2B is a sectional view taken along the line 2B-2B in FIG. 2A.

A strontium titanate layer having (110) face orientation and a thickness of about 2000 nm was film-formed on a (100) silicon substrate constituting a flow path substrate 201, thereby forming a vibrating plate 202. This plate was used as a substrate 203 of the dielectric film structure of the present invention. A mask was patterned on the strontium titanate layer in correspondence to positions where ink pressurizing chambers 208 are to be formed and platinum having (110) face orientation was epitaxial-grown by a spattering method, thereby forming a lower electrode 204 having a thickness of about 100 nm. A mask having a width of 100 µm and a length of 5 mm was patterned on the lower electrode 204 and a dielectric film 205 of 0.9 PZT-0.1 PMN solid solution having (110) face orientation was epitaxial-grown by an RF magnetron spattering method under the above-mentioned film forming conditions, thereby forming 200 dielectric films at a pitch of 200 dpi in a width-wise direction. A film thickness of the dielectric film, an element ratio between zirconium and titanium and a result of the X ray diffraction measurement are shown in the following Table 18. Further, platinum having a thickness of about 100 nm was film-formed on the dielectric film by a spattering method, thereby forming an upper electrode 206.

Ink pressurizing chambers 208, a common ink chamber 209, communication paths 210 connecting between the ink pressurizing chambers and the common ink chamber and a communication path (not shown) connecting between the common ink chamber and an ink tank were formed by reactive ion etching (RIE) from a lower side of the flow path substrate 201. Then, nozzles 212 were formed in another silicon substrate 211 at a pitch of 200 dpi by reactive ion etching (RIE) in correspondence to the respective ink pressurizing chambers 208, thereby forming a nozzle plate 211. The flow path substrate 201 and the nozzle plate 211 were joined together as shown in FIGS. 2A and 2B, thereby completing an ink jet head.

A discharging test was performed by using this ink jet head. It was found that an ink droplet of 13 pl can be discharged at a discharging speed of 13.8 m/sec and it was ascertained that an adequate discharging speed can be obtained.

TABLE 1

| Embodiment | $C_c$ | $W_c$ (°) | $C_a$ | $W_a$ (°) | u |
|---|---|---|---|---|---|
| 1 | 21079 | 0.26 | 5373 | 0.48 | 7.24 |
| 2 | 20873 | 0.24 | 5296 | 0.32 | 5.26 |
| 3 | 27664 | 0.36 | 9734 | 0.39 | 3.08 |
| 4 | 22486 | 0.34 | 9150 | 0.38 | 2.75 |
| 5 | 18667 | 0.47 | 9739 | 0.52 | 2.12 |

TABLE 2

| Embodiment | Film Thickness (µm) | Zr/Ti Ratio | $C_{nc}/C_a$ (%) | $C_{Ra}/C_a$ (%) | u | Applied Voltage (V) | Initial Displacement (µm) | Displacement After Endurance (µm) | Displacement Reduction Ratio (%) |
|---|---|---|---|---|---|---|---|---|---|
| 1 | 2.26 | 54/46 | 0.12 | 0.11 | 7.24 | ±70 | 1.27 | 1.27 | 0.00 |
| 2 | 1.36 | 55/45 | 0.08 | 0.12 | 5.26 | ±40 | 1.07 | 1.05 | 1.87 |
| 3 | 3.19 | 42/58 | 0.43 | 0.28 | 3.08 | ±95 | 0.91 | 0.88 | 3.30 |
| 4 | 1.83 | 41/59 | 0.34 | 0.26 | 2.75 | ±55 | 0.84 | 0.81 | 3.57 |
| 5 | 0.82 | 62/38 | 0.83 | 0.62 | 2.12 | ±25 | 0.74 | 0.70 | 5.41 |

TABLE 3

| Comparative Example | $C_c$ | $W_c$ (°) | $C_a$ | $W_a$ (°) | u |
|---|---|---|---|---|---|
| 1 | | | | | |
| 2 | 17873 | 0.81 | 9958 | 0.85 | 1.88 |
| 3 | 17844 | 0.79 | 9826 | 0.41 | 0.94 |
| 4 | 18781 | 0.68 | 13862 | 0.34 | 0.68 |
| 5 | 19187 | 0.57 | 13186 | 0.61 | 1.56 |
| 6 | 21989 | 0.26 | 14123 | 0.31 | 1.86 |
| 7 | 19914 | 0.57 | 14326 | 0.60 | 1.46 |

TABLE 4

| Comparative Example | Film Thickness (μm) | Zr/Ti Ratio | $C_{nc}/C_c$ (%) | $C_{na}/C_a$ (%) | u | Applied Voltage (V) | Initial Displacement (μm) | Displacement After Endurance (μm) | Displacement Reduction Ratio (%) |
|---|---|---|---|---|---|---|---|---|---|
| 1 | 2.82 | 52/48 | | | | ±85 | 0.18 | 0.15 | 16.67 |
| 2 | 1.62 | 61/39 | 32.74 | 35.31 | 1.88 | ±50 | 0.26 | 0.20 | 23.08 |
| 3 | 1.35 | 43/57 | 0.75 | 0.89 | 0.94 | ±40 | 0.25 | 0.18 | 28.00 |
| 4 | 2.40 | 55/45 | 0.97 | 1.65 | 0.68 | ±72 | 0.28 | 0.20 | 28.57 |
| 5 | 2.72 | 60/40 | 0.59 | 0.27 | 1.56 | ±80 | 0.66 | 0.60 | 9.09 |
| 6 | 1.48 | 53/47 | 2.73 | 4.03 | 1.86 | ±45 | 0.62 | 0.55 | 11.29 |
| 7 | 2.06 | 39/61 | 5.75 | 6.89 | 1.46 | ±60 | 0.42 | 0.37 | 11.90 |

TABLE 5

| Embodiment | Film Thikness Ratio (μm) | Zr/Ti Ratio | $C_c$ | $W_c$ (°) | $C_a$ | $W_a$ (°) | u | $C_{nc}/C_c$ (%) | $C_{na}/C_a$ (%) |
|---|---|---|---|---|---|---|---|---|---|
| 6 | 10 | 55/45 | 7918 | 0.23 | 1929 | 0.51 | 7.22 | 0.23 | 0.25 |

TABLE 6

| Embodiment | Film Thikness Ratio (μm) | Zr/Ti Ratio | $C_c$ | $W_c$ (°) | $C_a$ | $W_a$ (°) | u | $C_{nc}/C_c$ (%) | $C_{na}/C_a$ (%) |
|---|---|---|---|---|---|---|---|---|---|
| 7 | 2.04 | 51/49 | 20142 | 0.29 | 5105 | 0.53 | 7.21 | 0.65 | 0.69 |

TABLE 7

| Embodiment | $C_{111}$ | $W_{111}$ (°) | $C_{-110}$ | $W_{-110}$ (°) | u |
|---|---|---|---|---|---|
| 8 | 4031 | 1.18 | 2106 | 4.48 | 7.27 |
| 9 | 5218 | 2.87 | 1324 | 3.86 | 5.30 |
| 10 | 1931 | 1.15 | 2106 | 4.08 | 3.25 |
| 11 | 2810 | 4.75 | 1143 | 5.30 | 2.74 |
| 12 | 5833 | 3.78 | 2843 | 4.16 | 2.26 |

TABLE 8

| Embodiment | Film Thickness (μm) | Zr/Ti Ratio | $C_{n111}/C_{111}$ (%) | $C_{n110}/C_{-110}$ (%) | u | Applied Voltage (V) | Initial Displacement (μm) | Displacement After Endurance (μm) | Displacement Reduction Ratio (%) |
|---|---|---|---|---|---|---|---|---|---|
| 8 | 2.88 | 44/56 | 0.25 | 0.32 | 7.27 | ±85 | 1.14 | 1.13 | 0.88 |
| 9 | 1.75 | 53/47 | 0.21 | 0.24 | 5.30 | ±50 | 1.03 | 1.01 | 1.94 |
| 10 | 1.21 | 60/40 | 0.36 | 0.25 | 3.25 | ±35 | 0.96 | 0.94 | 2.08 |
| 11 | 2.45 | 56/44 | 0.44 | 0.71 | 2.74 | ±75 | 0.85 | 0.82 | 3.53 |
| 12 | 3.26 | 42/58 | 0.47 | 0.56 | 2.26 | ±100 | 0.78 | 0.74 | 5.13 |

TABLE 9

| Comparative Example | $C_{111}$ | $W_{111}$ (°) | $C_{-110}$ | $W_{-110}$ (°) | u |
|---|---|---|---|---|---|
| 8 | 1685 | 5.83 | 1106 | 6.30 | 1.65 |
| 9 | 4878 | 2.26 | 3207 | 1.17 | 0.79 |
| 10 | 6737 | 5.98 | 4879 | 2.99 | 0.69 |
| 11 | 3356 | 3.89 | 3263 | 4.75 | 1.26 |
| 12 | 3664 | 2.60 | 2353 | 3.10 | 1.86 |
| 13 | 2844 | 1.78 | 2387 | 1.88 | 1.26 |

TABLE 10

| Comparative Example | Film Thickness (μm) | Zr/Ti Ratio | $C_{n111}/C_{111}$ (%) | $C_{n110}/C_{-110}$ (%) | u | Applied Voltage (V) | Initial Displacement (μm) | Displacement After Endurance (μm) | Displacement Reduction Ratio (%) |
|---|---|---|---|---|---|---|---|---|---|
| 8 | 2.10 | 58/42 | 38.67 | 39.44 | 1.65 | ±65 | 0.29 | 0.23 | 20.69 |
| 9 | 1.26 | 56/44 | 0.93 | 1.14 | 0.79 | ±40 | 0.26 | 0.19 | 26.92 |
| 10 | 2.47 | 38/62 | 0.25 | 0.37 | 0.69 | ±75 | 0.29 | 0.21 | 27.59 |
| 11 | 2.28 | 48/52 | 0.84 | 0.63 | 1.26 | ±70 | 0.69 | 0.63 | 8.70 |
| 12 | 3.12 | 58/42 | 3.67 | 3.85 | 1.86 | ±95 | 0.64 | 0.56 | 12.50 |
| 13 | 1.86 | 57/43 | 7.55 | 8.76 | 1.26 | ±55 | 0.45 | 0.39 | 13.33 |

TABLE 11

| Embodiment | Film Thickness (nm) | Zr/Ti Ratio | $C_{111}$ | $W_{111}$ (°) | $C_{-110}$ | $W_{-110}$ (°) | W | $C_{n111}/C_{111}$ (%) | $C_{n-110}/C_{-110}$ (%) |
|---|---|---|---|---|---|---|---|---|---|
| 13 | 10 | 53/47 | 6255 | 2.82 | 1878 | 6.12 | 7.23 | 0.76 | 0.83 |

TABLE 12

| Embodiment | Film Thickness (nm) | Zr/Ti Ratio | $C_{111}$ | $W_{111}$ (°) | $C_{-110}$ | $W_{-110}$ (°) | W | $C_{n111}/C_{111}$ (%) | $C_{n-110}/C_{-110}$ (%) |
|---|---|---|---|---|---|---|---|---|---|
| 14 | 2.13 | 60/40 | 5542 | 2.21 | 2254 | 6.54 | 7.28 | 0.36 | 0.45 |

TABLE 13

| Embodiment | $C_{110}$ | $W_{110}$ (°) | $C_{001}$ | $W_{001}$ (°) | W |
|---|---|---|---|---|---|
| 15 | 3224 | 1.29 | 1850 | 5.28 | 7.13 |
| 16 | 2816 | 1.27 | 1726 | 4.08 | 5.24 |
| 17 | 2566 | 1.76 | 1487 | 3.39 | 3.32 |
| 18 | 2494 | 2.98 | 1662 | 5.34 | 2.69 |
| 19 | 2638 | 2.56 | 1872 | 3.98 | 2.19 |

TABLE 14

| Embodiment | Film Thickness (μm) | Zr/Ti Ratio | $C_{n110}/C_{110}$ (%) | $C_{n001}/C_{001}$ (%) | W | Applied Voltage (V) | Initial Displacement (μm) | Displacement After Endurance (μm) | Displacement Reduction Ratio (%) |
|---|---|---|---|---|---|---|---|---|---|
| 15 | 2.52 | 70/30 | 0.15 | 0.17 | 7.13 | 70 | 1.18 | 1.17 | 0.85 |
| 16 | 2.38 | 68/32 | 0.19 | 0.25 | 5.24 | 70 | 1.02 | 1.00 | 1.96 |
| 17 | 2.47 | 75/25 | 0.37 | 0.33 | 3.32 | 70 | 0.93 | 0.91 | 2.15 |
| 18 | 2.64 | 71/29 | 0.40 | 0.45 | 2.69 | 70 | 0.80 | 0.77 | 3.75 |
| 19 | 2.19 | 70/30 | 0.25 | 0.28 | 2.19 | 50 | 0.71 | 0.67 | 5.63 |

TABLE 15

| Comparative Example | $C_{110}$ | $W_{110}$ (°) | $C_{001}$ | $W_{001}$ (°) | W |
|---|---|---|---|---|---|
| 14 | 2153 | 3.25 | 1882 | 4.86 | 1.71 |
| 15 | 2382 | 3.78 | 1834 | 4.13 | 1.42 |
| 16 | 2127 | 4.56 | 2079 | 3.92 | 0.88 |

TABLE 16

| Comparative Example | Film Thickness (μm) | Zr/Ti Ratio | $C_{n110}/C_{110}$ (%) | $C_{n001}/C_{001}$ (%) | W | Applied Voltage (V) | Initial Displacement (μm) | Displacement After Endurance (μm) | Displacement Reduction Ratio (%) |
|---|---|---|---|---|---|---|---|---|---|
| 14 | 2.46 | 68/32 | 0.57 | 0.17 | 1.71 | 70 | 0.61 | 0.55 | 9.84 |
| 15 | 2.50 | 72/28 | 0.34 | 0.25 | 1.42 | 70 | 0.58 | 0.51 | 12.07 |
| 16 | 2.52 | 75/25 | 2.92 | 3.17 | 0.88 | 70 | 0.44 | 0.38 | 13.64 |

TABLE 17

| Embodiment | Film Thickness (nm) | Zr/Ti Ratio | $C_{110}$ | $W_{110}$ (°) | $C_{001}$ | $W_{001}$ (°) | W | $C_{n110}/C_{110}$ (%) | $C_{n001}/C_{001}$ (%) |
|---|---|---|---|---|---|---|---|---|---|
| 20 | 10 | 68/32 | 3064 | 1.12 | 2180 | 5.73 | 7.19 | 0.26 | 0.31 |

TABLE 18

| Embodiment | Film Thickness (μm) | Zr/Ti Ratio | $C_{110}$ | $W_{110}$ (°) | $C_{001}$ | $W_{001}$ (°) | W | $C_{n110}/C_{110}$ (%) | $C_{n001}/C_{001}$ (%) |
|---|---|---|---|---|---|---|---|---|---|
| 21 | 2.21 | 65/35 | 2972 | 1.21 | 1815 | 5.27 | 7.13 | 0.31 | 0.44 |

What is claimed is:

1. A dielectric film structure having a substrate and a dielectric film provided on said substrate, wherein:
   said dielectric film has (110) face orientation with respect to said substrate; and
   a value w regarding said dielectric film is a real number greater than 2 in the following equation:

$$w = (C_{110}/C_{00m}) \times (W_{00m}/W_{110}),$$

where $C_{110}$ is a count number of a peak of a (110) face of said dielectric film in an Out-of-plane X ray diffraction measurement, $C_{00m}$ is a count number of a peak of a (00m) face of said dielectric film in an In-plane X ray diffraction measurement, m being a natural number selected so that $C_{00m}$ becomes maximum, $W_{110}$ is a half-value width of a peak of the (110) face of said dielectric film in an Out-of-plane rocking curve X ray diffraction measurement, and $W_{00m}$ is a half-value width of a peak of the (00m) face of said dielectric film in an In-plane rocking curve X ray diffraction measurement.

2. A dielectric film structure according to claim 1, wherein, in said dielectric film, a count number of faces not parallel to the (110) face is smaller than 10% of a count number of the (110) face in the Out-of-plane X ray diffraction measurement and a count number of faces not parallel to the (−110) face is smaller than 10% of a count number of the (−110) face in the In-plane X ray diffraction measurement.

3. A piezoelectric actuator comprising:
   a dielectric film structure according to claim 1; and
   an electrode for applying voltage to said dielectric film structure.

4. An ink jet head comprising:
   a piezoelectric actuator including a dielectric film structure according to claim 1 and an electrode for applying voltage to said dielectric film structure, and wherein said piezoelectric actuator is driven to discharge ink.

* * * * *